(12) United States Patent
Lee et al.

(10) Patent No.: US 8,338,300 B2
(45) Date of Patent: Dec. 25, 2012

(54) SLURRY COMPOSITION FOR CHEMICAL-MECHANICAL POLISHING AND METHOD OF CHEMICAL-MECHANICAL POLISHING WITH THE SAME

(75) Inventors: Jong-won Lee, Seongnam-si (KR); Chang-ki Hong, Seongnam-si (KR); Sang-yeob Han, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 905 days.

(21) Appl. No.: 12/219,985

(22) Filed: Jul. 31, 2008

(65) Prior Publication Data

US 2009/0203213 A1    Aug. 13, 2009

(30) Foreign Application Priority Data

Feb. 12, 2008    (KR) .................. 10-2008-0012611

(51) Int. Cl.
  *H01L 21/302* (2006.01)
(52) U.S. Cl. ........... 438/692; 438/691; 438/693; 216/89

(58) Field of Classification Search ................ None
  See application file for complete search history.

(56) References Cited

U.S. PATENT DOCUMENTS

| | | | |
|---|---|---|---|
| 6,540,935 B2 * | 4/2003 | Lee et al. ............. | 252/79.1 |
| 7,041,599 B1 * | 5/2006 | Li et al. ............... | 438/692 |
| 2006/0234509 A1 * | 10/2006 | Small et al. ........... | 438/692 |

FOREIGN PATENT DOCUMENTS

| | | |
|---|---|---|
| KR | 1020020029158 | 4/2002 |
| KR | 1020020077636 | 10/2002 |
| KR | 1020050122754 | 12/2005 |

* cited by examiner

*Primary Examiner* — Lan Vinh
*Assistant Examiner* — Jiong-Ping Lu
(74) *Attorney, Agent, or Firm* — Harness, Dickey & Pierce, P.L.C.

(57) ABSTRACT

Provided may be a slurry composition for chemical mechanical polishing (CMP) and a CMP method using the same. For example, the slurry composition may include a first polishing inhibitor including at least one of $PO_4^{3-}$ or $HPO_4^{2-}$ and a second polishing inhibitor, which may be a $C_2$-$C_{10}$ hydrocarbon compound having —$SO_3H$ or —$OSO_3H$. By using the slurry composition for CMP and a CMP method using the same, increased selectivity to SiN may be obtained.

7 Claims, 5 Drawing Sheets

SLURRY COMPOSITION FOR CHEMICAL-MECHANICAL POLISHING AND METHOD OF CHEMICAL-MECHANICAL POLISHING WITH THE SAME

PRIORITY STATEMENT

This application claims priority under U.S.C. §119 to Korean Patent Application No. 10-2008-0012611, filed on Feb. 12, 2008, in the Korean Intellectual Property Office (KIPO), the entire contents of which are incorporated herein by reference.

BACKGROUND

1. Field

Example embodiments relate to a slurry composition for chemical-mechanical polishing (CMP) and a CMP method employing the same, and more particularly, to a slurry composition for chemical-mechanical polishing, having a higher selectivity to SiN, and a CMP method employing the same.

2. Description of the Related Art

Figure 1A:
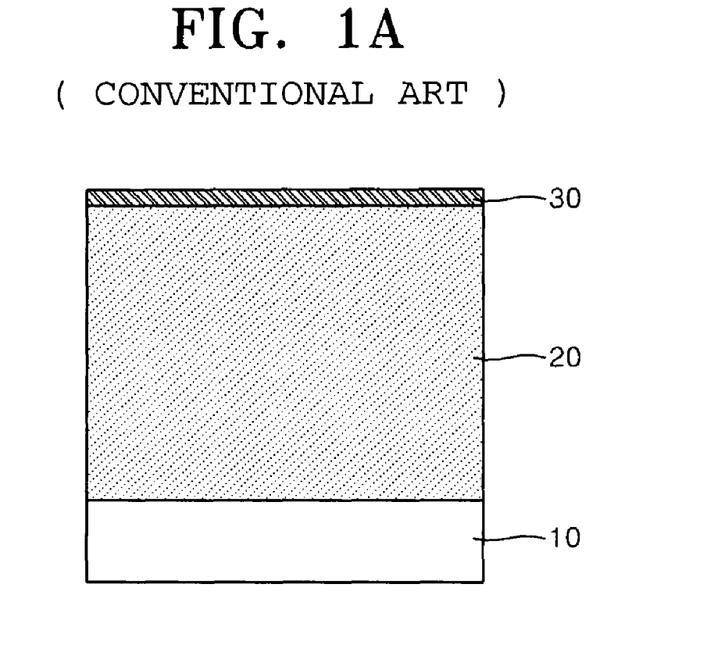
FIGS. 1A-1H are side-sectional views illustrating a conventional method of separating a node of a top electrode of a capacitor.

In processes of manufacturing a semiconductor device, a chemical mechanical polishing (CMP) method may be widely used to separate a node of a top electrode of a capacitor, as illustrated in FIGS. 1A-1H. Referring to FIG. 1A, a silicon oxide layer 20 may be formed on a semiconductor substrate 10, and a silicon nitride layer 30 may be formed on the silicon oxide layer 20. The silicon nitride layer 30 may act as a CMP stopping layer in the subsequent process.

Figure 1B:
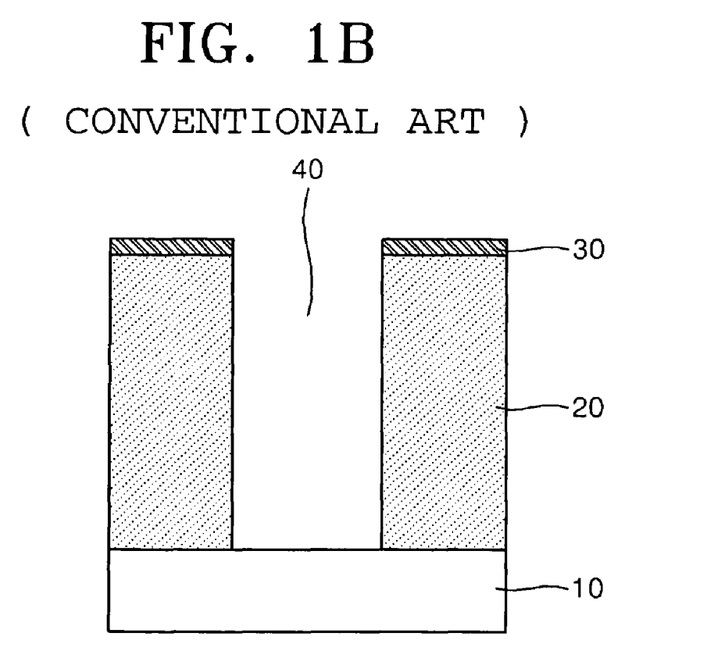
Figure 1C:
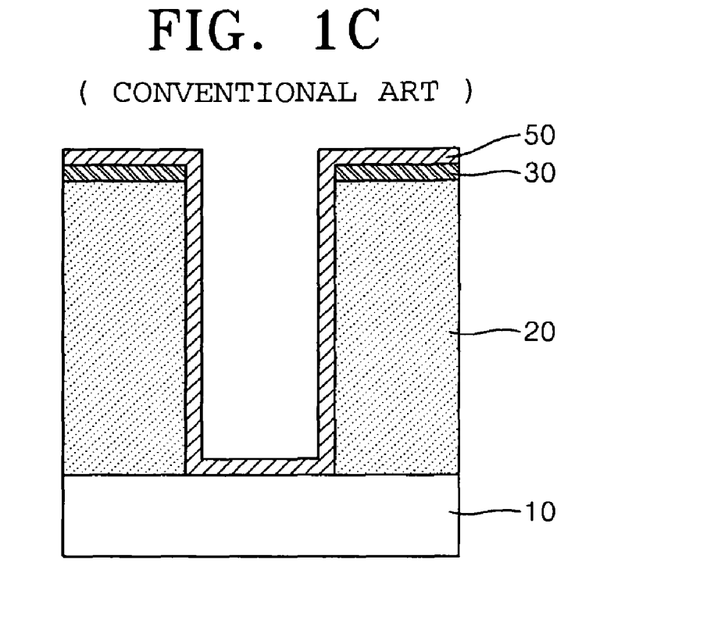

Referring to FIG. 1B, a trench 40 may be formed using a photolithography method so as to expose a location in which a TiN capacitor may be formed. Referring to FIG. 1C, a TiN layer 50 may be deposited on the exposed surface of the silicon nitride layer 30, the silicon oxide layer 20 and the semiconductor substrate 10. The TiN layer 50 may be formed using a known method, e.g., chemical vapor deposition.

Figure 1D:
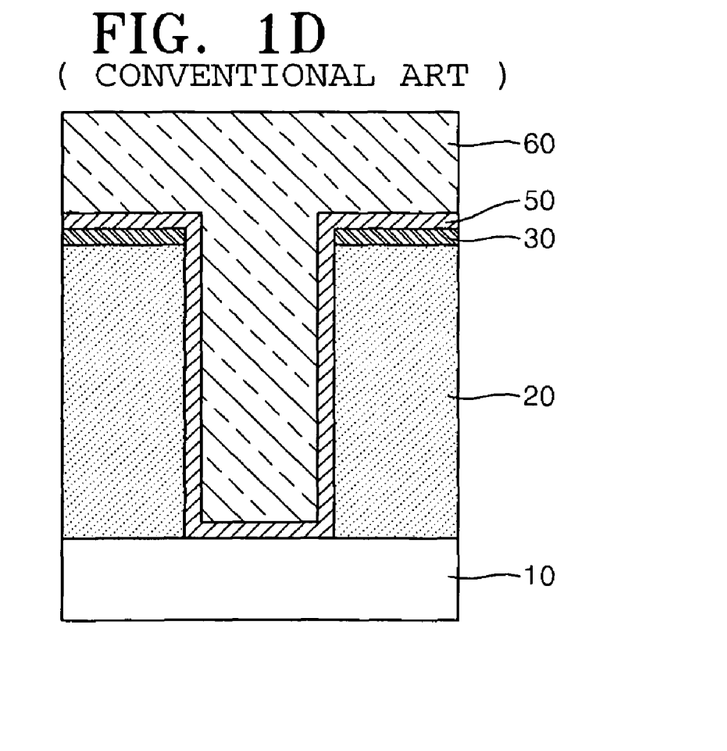
Figure 1E:
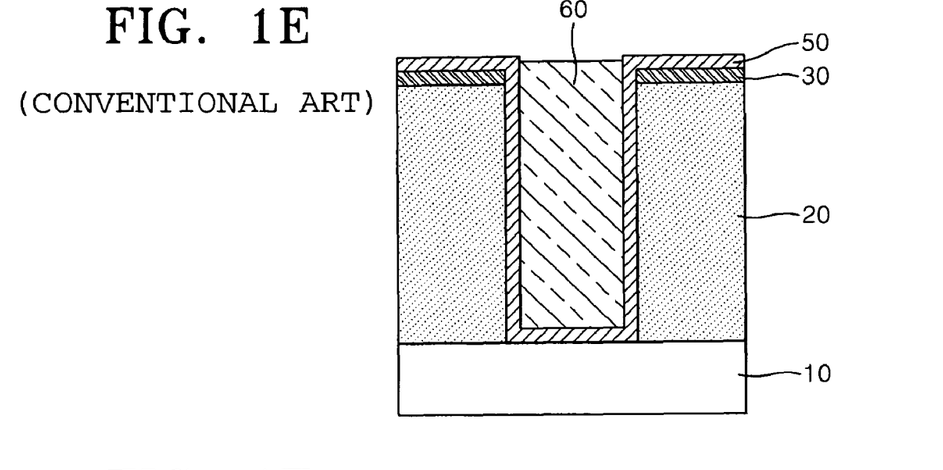
Figure 1F:
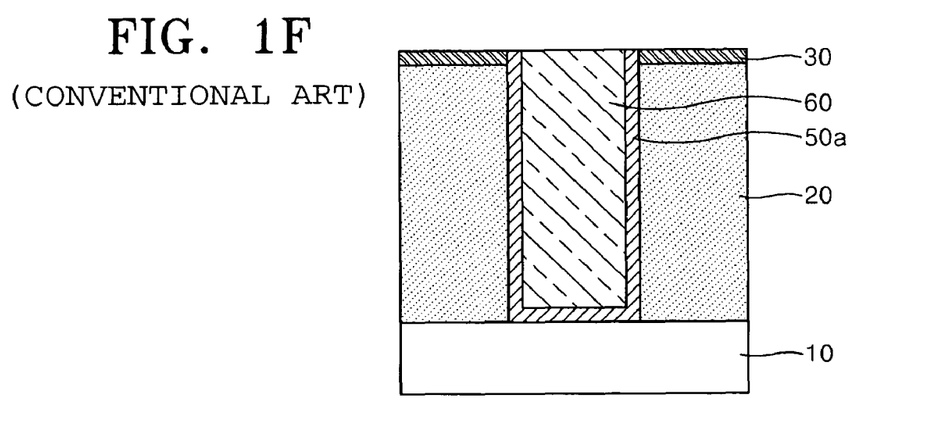
Figure 1G:
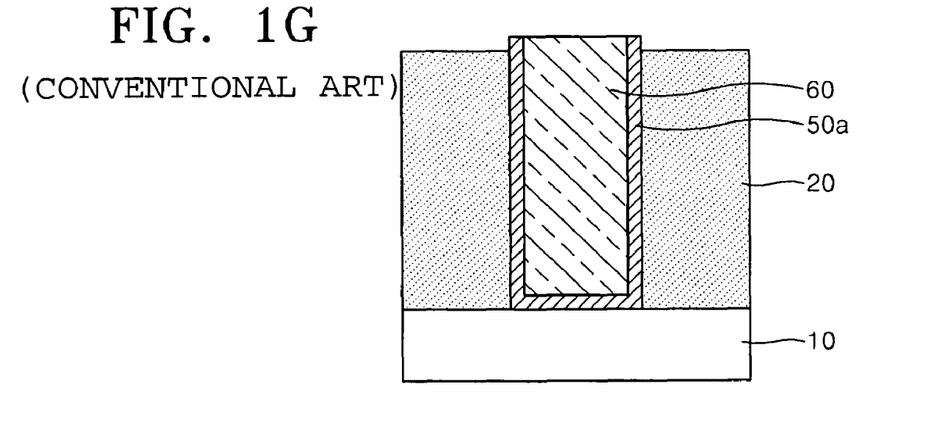
Figure 1H:
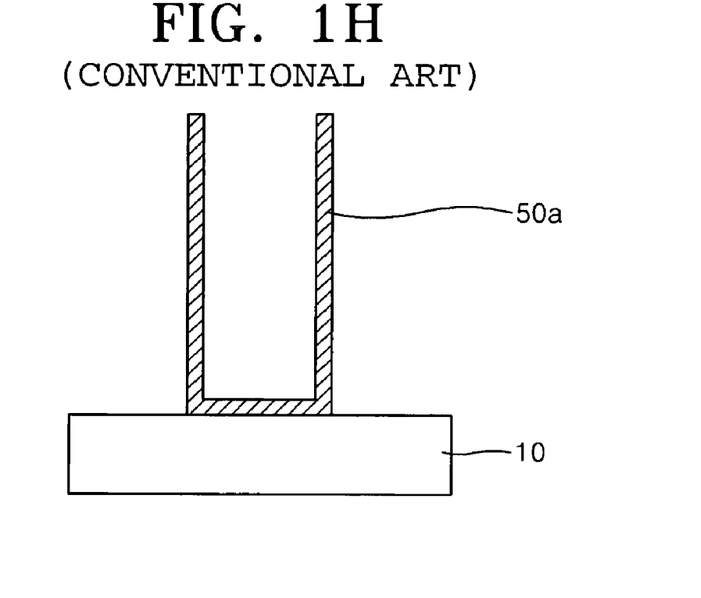

Referring to FIG. 1D, a sacrificial oxide layer 60, acting as a sacrificial layer, may fill the trench 40 and may be formed on the TiN layer 50. As illustrated in FIG. 1E, a portion of the TiN layer 50 removed by CMP may be exposed by performing an etch-back process. Referring to FIG. 1F, an individual TiN node 50a may be formed by performing CMP to separate a TiN node, and the silicon nitride layer 30 may be removed by stripping as illustrated in FIG. 1G. In FIG. 1H, the sacrificial oxide layer 60 and the silicon oxide layer 20 may also be removed by stripping.

In a process of separating a TiN node, when a CMP stopping layer is formed of silicon oxide, a conventional metallic slurry may be sufficient for CMP because the removal rate of the silicon oxide may be relatively low. However, as the design rule is reduced and SiN is used to form a CMP stopping layer, the conventional metallic slurry may not be used because SiN may be more easily removed with the conventional metallic slurry including a ceria ($CeO_2$) polishing agent even when the conventional metallic slurry may have a strong acid condition, e.g., pH of about 3 or less, and even when the solid content of the conventional slurry metallic may be less than about 1 wt. %.

SUMMARY

Example embodiments provide a slurry composition for chemical-mechanical polishing (CMP), the slurry composition having increased selectivity to SiN. Example embodiments also provide a CMP method capable of improving selectivity to SiN.

According to example embodiments, a slurry composition for chemical mechanical polishing (CMP) may include a solvent, a polishing agent made of metal oxide, an oxidant, a first polishing inhibitor, wherein the first polishing inhibitor is a phosphate salt including at least one of $HPO_4^{2-}$ or $PO_4^{3-}$, a second polishing inhibitor, wherein the second polishing inhibitor $C_2$-$C_{10}$ hydrocarbon compound having —$SO_3H$ or —$OSO_3H$, and a dispersion stabilizer, wherein based on about 100 wt. % of the slurry composition, the content of the polishing agent may be in a range of about 0.01 wt. % to about 1 wt. %, the content of the oxidant may be in a range of about 0.5 wt. % to about 5 wt. %, the content of the first polishing inhibitor may be in a range of about 0.001 wt. % to about 10 wt. %, the content of the second polishing inhibitor may be in a range of about 0.001 wt. % to about 10 wt. %, the content of the dispersion stabilizer may be in a range of about 0.001 wt. % to about 10 wt. %, with the balance being the solvent.

The first polishing inhibitor may include an ammonium hydrogen phosphate (AHP). The second polishing inhibitor may be a compound represented by Formula 2 or Formula 3:

<Formula 2>

<Formula 3> where n may be each independently an integer ranging from 1 to 5, and when the repeating unit may be complete, both ends of the compound represented by Formula 2 or Formula 3 may be hydrogen atoms. The second polishing inhibitor may be selected from polyvinyl sulfonic acid (PVSA), polyvinyl sulfate (PVS), and salts thereof.

The pH of the slurry composition may be in a range of about 0.5 to about 3. The polishing agent may include at least one compound selected from the group consisting of silica ($SiO_2$), alumina ($Al_2O_3$), titania ($TiO_2$), ceria ($CeO_2$), zirconia ($ZrO_2$), and germania ($GeO_2$). The diameter of a primary particle of the polishing agent may be in a range of about 5 nm to about 200 nm, and the diameter of a secondary particle of the polishing agent may be in a range of about 10 nm to about 1000 nm.

The content of the first polishing inhibitor may be in a range of about 0.001 wt. % to about 0.5 wt. %, based on about 100 wt. % of the slurry composition, and the content of the second polishing inhibitor may be in a range of about 0.001 wt. % to about 0.5 wt. %, based on about 100 wt. % of the slurry composition. The content of the dispersion stabilizer may be in a range of about 0.001 wt. % to about 0.1 wt. %, for example, about 0.001 wt. % to about 0.05 wt. %, based on about 100 wt. % of the slurry composition.

According to example embodiments, a method of chemical mechanical polishing may include contacting a surface of a semiconductor substrate with a surface of a polishing pad, providing a slurry composition to an interface between the surface of the semiconductor substrate and the surface of the polishing pad, wherein the slurry composition may include a solvent, a polishing agent made of metal oxide, an oxidant, a first polishing inhibitor, wherein the first polishing inhibitor is a phosphate salt including at least one of $HPO_4^{2-}$ or $PO_4^{3-}$, a second polishing inhibitor, wherein the second polishing inhibitor $C_2$-$C_{10}$ hydrocarbon compound having —$SO_3H$ or —$OSO_3H$, and a dispersion stabilizer, and further wherein based on about 100 wt. % of the slurry composition, the content of the polishing agent may be in a range of about 0.01 wt. % to about 1 wt. %, the content of the oxidant may be in a range of about 0.5 wt. % to about 5 wt. %, the content of the first polishing inhibitor may be in a range of about 0.001 wt. % to about 10 wt. %, the content of the second polishing inhibitor may be in a range of about 0.001 wt. % to about 10 wt. %, the content of the dispersion stabilizer may be in a range of about 0.001 wt. % to about 10 wt. %, with the balance being the solvent, and rotating the surface of the semiconductor substrate with respect to the surface of the polishing pad.

By using a slurry composition for CMP according to example embodiments and a CMP method using the same according to example embodiments, increased selectivity to SiN may be obtained.

BRIEF DESCRIPTION OF THE DRAWINGS

Example embodiments will be more clearly understood from the following detailed description taken in conjunction with the accompanying drawings. FIGS. 1A-4 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity. Detailed illustrative embodiments are disclosed herein. However, specific structural and functional details disclosed herein are merely representative for purposes of describing example embodiments. Example embodiments, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A slurry composition for chemical mechanical polishing (CMP), according to example embodiments, may include a solvent, a polishing agent, an oxidant, a first polishing inhibitor, a second polishing inhibitor, and a dispersion stabilizer. In this regard, based on about 100 wt. % of the slurry composition, the content of the polishing agent, which may be metal oxide, may be in a range of about 0.01 wt. % to about 1 wt. %, the content of the oxidant may be in a range of about 0.5 wt. % to about 5 wt. %, the content of the first polishing inhibitor may be in a range of about 0.001 wt. % to about 10 wt. %, the content of the second polishing inhibitor may be in a range of about 0.001 wt. % to about 10 wt. %, the content of the dispersion stabilizer may be in a range of about 0.001 wt. % to about 10 wt. %, with the balance being the solvent. The first polishing inhibitor may include at least one of $HPO_4^{2-}$ or $PO_4^{3-}$ and the second polishing inhibitor may be a $C_2$-$C_{10}$ hydrocarbon compound having —$SO_3H$ or —$OSO_3H$.

The interaction between the first polishing inhibitor and the second polishing inhibitor used in example embodiments may lead to a more rapid decrease in the removal rate of a SiN layer than when only one of the first polishing inhibitor and the second polishing inhibitor may be used. The first polishing inhibitor may be a phosphate-based additive. For example, the first polishing inhibitor may be a compound having at least one of $HPO_4^{2-}$ or $PO_4^{3-}$ in its molecular structure or a salt thereof. For example, the first polishing inhibitor may be ammonium hydrogen phosphate (AHP), as represented by Formula 1:

<Formula 1>

The AHP may be dissociated in a solvent and may be present in the form of $PO_4^{3-}$ or $HPO_4^{2-}$. When the AHP is present in the form of $PO_4^{3-}$, a hydrogen atom, which is ionically bonded to an oxygen atom in Formula 1, may be dissociated. $PO_4^{3-}$ or $HPO_4^{2-}$ may be adsorbed to the surface of the SiN layer and may decrease the removal rate of SiN. $PO_4^{3-}$ or $HPO_4^{2-}$ may exist in the form of a salt that is more easily dissolved to form slurry.

The content of the first polishing inhibitor may be in a range of about 0.001 wt. % to about 10 wt. %, for example, in a range of about 0.001 wt. % to about 0.5 wt. %, based on about 100 wt. % of the slurry composition. When the content of the first polishing inhibitor is relatively small, the effect of the first polishing inhibitor, for example, the decrease in the removal rate of SiN, may be insufficient. On the other hand, when the content of the first polishing inhibitor is relatively large, the pH of the slurry composition may be increased and the removal rate of TiN may be decreased.

The second polishing inhibitor may be a $C_2$-$C_{10}$ hydrocarbon compound having —$SO_3H$ and/or —$OSO_3H$ and may be represented by Formula 2 or Formula 3:

<Formula 2>

<Formula 3>

In the compounds represented by Formulae 2 and 3, n may be an integer of 1 to 5, and the ends of the terminal repeating unit may be terminated with hydrogen atoms. Also, in the compounds represented by Formulae 2 and 3, —$SO_3H$ or —$OSO_3H$ may be an alkali metal salt of —$SO_3H$ or —$OSO_3H$. —$SO_3H$ and —$OSO_3H$ may be more easily dissociated in a solvent to liberate a hydrogen ion, thereby becoming an anion. Because —$SO_3H$ and —$OSO_3H$ is present in the form of an anion, the removal rate of SiN may be effectively decreased.

Based on about 100 wt. % of the slurry composition, the content of the second polishing inhibitor may be in a range of about 0.001 wt. % to about 10 wt. %, for example, in a range of about 0.001 wt. % to about 0.5 wt. %. When the content of the second polishing inhibitor is relatively small, the effect of the second polishing inhibitor may be insufficient. On the other hand, when the content of the second polishing inhibitor is relatively large, the performance of the first polishing inhibitor may be degraded.

In the slurry composition for CMP according to example embodiments, the content of the polishing agent may be in a range of about 0.01 wt. % to about 1 wt. % based on about 100 wt. % of the slurry composition. The polishing agent may include metal oxide, e.g., ceria ($CeO_2$), silica ($SiO_2$), zirconia ($ZrO_2$), alumina ($Al_2O_3$), titania ($TiO_2$), germania ($GeO_2$), or a mixture thereof. When the polishing agent includes $CeO_2$, problems caused due to a difference in density between a pattern region and a non-pattern region may be prevented or reduced.

The diameter of a primary particle of the polishing agent may be in a range of about 5 nm to about 200 nm, and the diameter of a secondary particle of the polishing agent may be in a range of about 10 nm to about 1000 nm. In this regard, the diameter of each of the first and second particles may be a maximum value of the distances between two points in each particle.

The solvent may be deionized water, and may act as a solvent when used together with a material that is completely dissolved in the solvent, for example, used together with the first polishing inhibitor and/or the second polishing inhibitor. However, the solvent may also act as a dispersing medium when used together with micro-sized metal oxide particles, e.g., the polishing agent. For example, the solvent may act as a solvent and a dispersing medium, but in example embodiments, even when the solvent acts as a dispersing medium, the solvent will be consistently referred to as a solvent for convenience.

The oxidant may be a peroxide-based additive. For example, the oxidant may be hydrogen peroxide ($H_2O_2$). The content of the oxidant may be in a range of about 0.5 wt. % to about 5 wt. %, based on about 100 wt. % of the slurry composition. When the content of the oxidant is relatively small, the removal rate may be insufficient. For example, for TiN, the corrosion problem due to hydrogen peroxide may not be significant, which may be advantageous. Also, the removal rate may increase in proportion to the concentration of the oxidant.

In the slurry composition for CMP according to example embodiments, particles that form the polishing agent may have different cohesive forces according to the type of polishing agent. For example, ceria may have increased cohesive force. Therefore, the slurry composition may further include a dispersion stabilizer to promote dispersion of the polishing agent, to prevent or reduce agglomeration of the polishing agent so as to increase storage stability of the slurry composition, and to improve reproduction stability of the slurry composition.

Based on about 100 wt. % of the slurry composition, the content of the dispersion stabilizer may be in a range of about 0.001 wt. % to about 10 wt. %, for example, in a range of about 0.001 wt. % to about 0.1 wt. %, or in a range of about 0.001 wt. % to about 0.05 wt. %. When the content of the dispersion stabilizer is relatively small, the dispersion stability may be insufficient. On the other hand, when the content of the dispersion stabilizer is relatively large, the manufacturing time for slurry may be increased, the viscosity of the slurry composition may be relatively high and the dispersion stability may be decreased.

The dispersion stabilizer may be a cellulose-based compound, e.g., hydroxyethyl cellulose or hydroxypropyl cellulose, poly(acrylic acid), a salt of the poly(acrylic acid), poly(acrylic acid-co-maleic acid), a salt of the poly(acrylic acid-co-maleic acid), poly(acrylonitril-co-butadiene-acrylic acid), a salt of the poly(acrylonitril-co-butadiene-acrylic acid), or a diol-based compound. However, the dispersion stabilizer may not be limited to the compounds described above.

The pH of the slurry composition for CMP according to example embodiments may be in a range of about 0.5 to about 3. When the pH of the composition is relatively high, the selectivity may be decreased. On the other hand, when the pH of the slurry composition for CMP is relatively low, the removal rate may be undesirably high. When the pH of the slurry composition for CMP is undesirable, the pH may be controlled with a pH controller. The pH controller may be an acid solution, e.g., sulfuric acid, phosphoric acid, hydrochloric acid, nitric acid, or carboxylic acid and/or an alkali solution, e.g., potassium hydroxide, ammonium hydroxide, or sodium hydroxide.

A method of chemical-mechanical polishing (CMP) according to example embodiments may include contacting a surface of a semiconductor substrate with a surface of a polishing pad, providing a slurry composition to an interface between the surface of the semiconductor substrate and the surface of the polishing pad, wherein the slurry composition may include a solvent, a polishing agent made of metal oxide, an oxidant, a first polishing inhibitor, wherein the first polishing inhibitor is a phosphate salt including at least one of $HPO_4^{2-}$ or $PO_4^{3-}$, a second polishing inhibitor, wherein the second polishing inhibitor $C_2$-$C_{10}$ hydrocarbon compound having —$SO_3H$ or —$OSO_3H$, and a dispersion stabilizer, and further wherein based on about 100 wt. % of the slurry composition, the content of the polishing agent may be in a range of about 0.01 wt. % to about 1 wt. %, the content of the oxidant may be in a range of about 0.5 wt. % to about 5 wt. %, the content of the first polishing inhibitor may be in a range of about 0.001 wt. % to about 10 wt. %, the content of the second polishing inhibitor may be in a range of about 0.001 wt. % to about 10 wt. %, the content of the dispersion stabilizer may be in a range of about 0.001 wt. % to about 10 wt. %, with the balance being the solvent, and rotating the surface of the semiconductor substrate with respect to the surface of the polishing pad.

Figure 2:
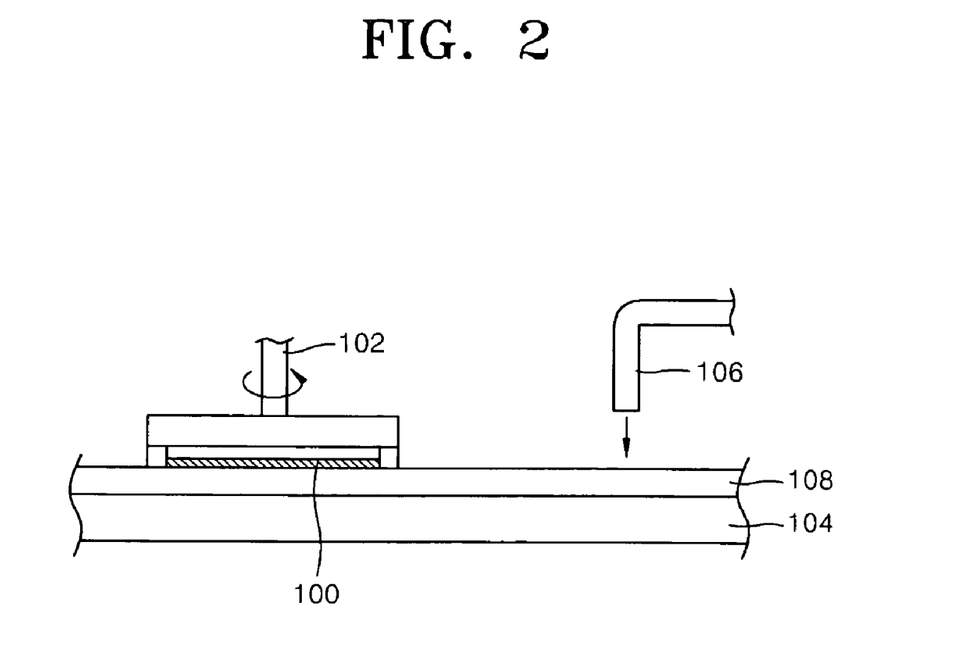
FIG. 2 is a schematic view of a chemical-mechanical polishing (CMP) device used to fabricate semiconductor devices, according to example embodiments.

FIG. 2 is a schematic view of a CMP device used to manufacture semiconductor devices, according to example embodiments. Referring to FIG. 2, the CMP device may include a polishing head 102, a polishing table 104, a slurry supply tube 106, and a polishing pad 108 formed on the polishing table 104. A CMP process may be performed on the polishing table 104. When slurry is provided through the slurry supply tube 106, the polishing head 102 may compress a semiconductor substrate 100 on the polishing pad 108 while rotating. In the CMP process, a first polishing inhibitor, a second polishing inhibitor, and a dispersion stabilizer may have the same type and the same contents as in other example embodiments.

Example embodiments will be described in further detail with reference to the following examples. These examples are for illustrative purposes only and are not intended to limit the scope of example embodiments.

EXPERIMENTAL EXAMPLE 1

The effect of the pH of a slurry composition in a polishing process was identified. The slurry composition used was a conventional slurry including ceria as a polishing agent. For example, the content of an oxidant (hydrogen peroxide) in the conventional slurry was about 2 wt %. A TiN blanket wafer including an about 2000 Å-thick silicon oxide on a silicon substrate was used for a sample wafer. The initial thickness of the silicon nitride layer in the sample wafer was about 2000 Å.

A polishing device was an 8-inch EBARA kit, and a pad was an IC1000 stack pad produced by Rodel Co. The polishing process was performed with a downward pressure of about 216 hPa, with a retaining ring pressure of about 255 hPa, at the platen speed of about 100 rpm, at the head speed of about 101 rpm, and at the slurry flow rate of about 200 ml/minute.

To measure the removal rate of TiN, the resistance of each wafer was measured by a 4-point probe resistance measurement and the obtained resistance values were converted into thickness values. The removal rate of SiN was measured using an optical-type thickness measuring device. The results are shown in Table 1.

TABLE 1

| No. | pH of the slurry composition | Removal rate of TiN (A/min.) | Removal rate of SiN (A/min.) | Selectivity (TiN/SiN) |
|---|---|---|---|---|
| 1 | 2.5 | 2545 | 1024 | 2.5:1 |
| 2 | 4.5 | 648 | 211 | 2.5:1 |
| 3 | 7 | 544 | 172 | 1.8:1 |

As shown in Table 1, as the pH of the slurry composition increases, both the removal rate of TiN and the removal rate of SiN decrease. Therefore, when the pH of the slurry composition is about 3 or less, the removal rate of TiN was sufficient. However, in the same pH range, the removal rate of SiN was still relatively high.

EXPERIMENTAL EXAMPLE 2

The effect of a first polishing inhibitor was identified using four types of slurry compositions in which the content of the first polishing inhibitor differs from each other. The pH of each of the slurry compositions was adjusted to about 2.5 using dilute sulfuric acid. A sample wafer, a polishing device, and a pad were the same as in Experimental Example 1. A polishing condition and a method of assessing experimental results were the same as in Experimental Example 1. Each of the slurry compositions included an oxidant (hydrogen peroxide) in an amount of about 2 wt %.

The results are shown in Table 2.

TABLE 2

| No. | Content of AHP (wt %) | Removal rate of TiN (A/min.) | Removal rate of SiN (A/min.) | Selectivity (TiN/SiN) |
|---|---|---|---|---|
| 4 | 0 | 2545 | 1024 | 2.5:1 |
| 5 | 0.01 | 2522 | 951 | 2.7:1 |
| 6 | 0.05 | 2243 | 811 | 2.8:1 |
| 7 | 0.1 | 2186 | 731 | 3.0:1 |

As shown in Table 2, as the concentration of AHP, for example, the first polishing inhibitor, increases, the removal rates of TiN and SiN decrease. However, the removal rate of SiN was decreased by a larger degree than the removal rate of TiN. Therefore, the selectivity of TiN to SiN increased. From Experimental Example 2, the addition of AHP results in a decrease in the removal rate of SiN and an increase in the selectivity of TiN to SiN.

EXPERIMENTAL EXAMPLE 3

The effect of a second polishing inhibitor was identified using four types of slurry compositions in which the content of the second polishing inhibitor differs from each other. The pH of each of the slurry compositions was adjusted to about 2.5 using diluted sulfuric acid. A sample wafer, a polishing device, and a pad were the same as in Experimental Example 1. A polishing condition and a method of assessing experimental results were the same as in Experimental Example 1. Each of the slurry compositions included an oxidant(hydrogen peroxide) in an amount of about 2 wt %.

The results are shown in Table 3.

TABLE 3

| No. | Content of PVSA (wt %) | Removal rate of TiN (A/min.) | Removal rate of SiN (A/min.) | Selectivity (TiN/SiN) |
|---|---|---|---|---|
| 8 | 0 | 2545 | 1024 | 2.5:1 |
| 9 | 0.01 | 2740 | 864 | 3.2:1 |
| 10 | 0.05 | 2530 | 495 | 5.1:1 |
| 11 | 0.1 | 2427 | 200 | 12:1 |

As shown in Table 3, as the concentration of PVSA, for example, the second polishing inhibitor increases, the removal rate of TiN and the removal rate of SiN illustrate different behavior from each other. When PVSA was added in an amount of about 0.01 wt %, the removal rate of TiN increased, and even when the content of PVSA was about 0.1 wt %, the removal rate of TiN was not significantly decreased. On the other hand, the removal rate of SiN may decrease as the concentration of PVSA increases. For example, the selectivity of TiN to SiN was increased and PVSA was suitable for decreasing the removal rate of SiN.

EXPERIMENTAL EXAMPLE 4

The synergy effect of the first polishing inhibitor and the second polishing inhibitor was identified using 10 types of slurry compositions. The pH of each slurry compositions was adjusted to about 2.5 using dilute sulfuric acid, and the content of oxidant(hydrogen peroxide) in each slurry composition was about 2 wt %. A sample wafer, a polishing device, and a pad were the same as in Experimental Example 1. A polishing condition and a method of assessing experimental results were the same as in Experimental Example 1.

The results are shown in Table 4.

TABLE 4

| No. | Content of AHP (wt. %) | Content of PVSA (wt. %) | Removal rate of TiN (A/min.) | Removal rate of SiN (A/min.) | Selectivity (TiN/SiN) |
|---|---|---|---|---|---|
| 12 | 0 | 0 | 2382 | 998 | 2.4:1 |
| 13 | 0.01 | 0.01 | 2899 | 744 | 3.9:1 |
| 14 |  | 0.05 | 2456 | 297 | 8.3:1 |
| 15 |  | 0.1 | 2523 | 99 | 26:1 |
| 16 | 0.05 | 0.01 | 2366 | 802 | 3:1 |
| 17 |  | 0.05 | 2509 | 177 | 14:1 |
| 18 |  | 0.1 | 2415 | 72 | 34:1 |
| 19 | 0.1 | 0.01 | 2461 | 699 | 3.5:1 |
| 20 |  | 0.05 | 2323 | 91 | 25:1 |
| 21 |  | 0.1 | 2309 | 60 | 39:1 |

As shown in Table 4, when the content of PVSA, for example, the second polishing inhibitor, was about 0.01 wt %, an increase in the content of AHP, for example, the first polishing inhibitor, did not affect selectivity. However, when the content of PVSA was about 0.05 wt % or more, the increase in the content of the AHP led to a decrease in the removal rate of SiN, for example, to more than twice as much as when only PVSA was used. For example, when the content of PVSA was fixed to about 0.05 wt %, an increase in the content of AHP led to an increase in the selectivity of TiN to SiN (8.3:1<14:1<25:1). In addition, when the content of PVSA was fixed to about 0.1 wt %, the increase in the content of AHP also led to an increase in the selectivity of TiN to SiN (26:1<34:1<39:1). When only AHP was used, like in Experimental Example 2, the decrease in the removal rate of SiN was relatively small. However, when AHP was used together with PVSA, the decrease in the removal rate of SiN was much greater than when only AHP was used.

In terms of PVSA, when only PVSA was used (Experimental Example 3), the SiN removal rate decrease was higher than when only AHP was used (Experimental Example 2.) However, when PVSA was used together with AHP, the decrease in the SiN removal rate was twice as effective as when only PVSA was used. For example, when AHP was not used, the selectivity was increased with a gradient of 3.2:1<5.1:1<12:1, but when AHP was used together with PVSA, in an amount of about 0.01 wt %, the selectivity increased with a gradient of 3.9:1<8.3:1<26:1. Also, when AHP was used together with PVSA, in an amount of about 0.05 wt %, the selectivity increased with a gradient of 3:1<14:1<34:1, and when AHP was used together with PVSA, in an amount of about 0.1 wt %, the selectivity was increased with a gradient of 3.5:1<25:1<39:1.

Figure 3:
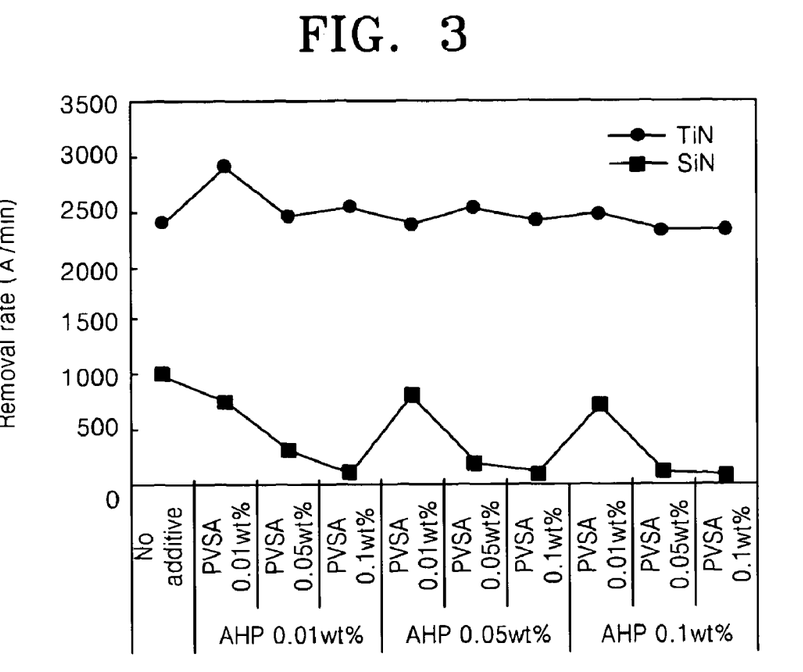
FIG. 3 is a graph illustrating a removal rate of TiN and SiN with respect to the content of first and second polishing inhibitors, according to example embodiments.
Figure 4:
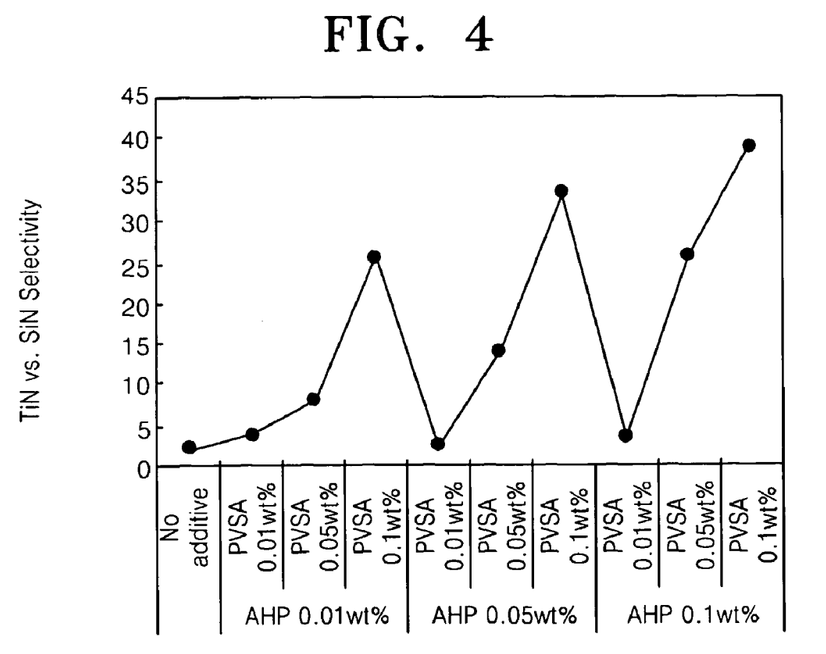
FIG. 4 is a graph illustrating TiN/SiN polishing selectivity with respect to the content of first and second polishing inhibitors, according to example embodiments.

FIG. 3 is a graph illustrating a removal rate of TiN and SiN with respect to the content of the first and second polishing inhibitors, according to example embodiments, and FIG. 4 is a graph illustrating TiN/SiN polishing selectivity with respect to the content of the first and second polishing inhibitors, according to example embodiments. Referring to FIGS. 3 and 4, when the first polishing inhibitor and the second polishing inhibitor are used together, a TiN/SiN polishing selectivity may increase.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of chemical mechanical polishing, the method comprising:
    contacting a titanium nitride (TiN) surface of a semiconductor substrate with a surface of a polishing pad, the semiconductor substrate including silicon nitride (SiN);
    providing a slurry composition to an interface between the TiN surface of the semiconductor substrate and the surface of the polishing pad,
    wherein the slurry composition includes a solvent, a polishing agent made of metal oxide, an oxidant, a first polishing inhibitor, wherein the first polishing inhibitor is a phosphate salt including at least one of $HPO_4^{2-}$ or $PO_4^{3-}$, a second polishing inhibitor, wherein the second polishing inhibitor is a $C_2$-$C_{10}$ hydrocarbon compound having —$SO_3H$ or —$OSO_3H$, and a dispersion stabilizer, and
    further wherein based on about 100 wt. % of the slurry composition, the content of the polishing agent is in a range of about 0.01 wt. % to about 1 wt. %, the content of the oxidant is in a range of about 0.5 wt. % to about 5 wt. %, the content of the first polishing inhibitor is in a range of about 0.001 wt. % to about 10 wt. %, the content of the second polishing inhibitor is in a range of about 0.001 wt. % to about 10 wt. %, the content of the dispersion stabilizer is in a range of about 0.001 wt. % to about 10 wt. %, with the solvent being a major component; and
    rotating the TiN surface of the semiconductor substrate with respect to the surface of the polishing pad to selectively remove at least a portion of TiN faster than SiN.

2. The method of claim 1, wherein the first polishing inhibitor is an ammonium hydrogen phosphate (AHP).

3. The method of claim 1, wherein the second polishing inhibitor is a compound represented by Formula 2 or Formula 3:

<Formula 2>

<Formula 3> wherein each n is independently an integer ranging from 1 to 5, and
wherein when the repeating unit is complete, both ends of the compound represented by Formula 2 or Formula 3 are hydrogen atoms.

4. The method of claim 3, wherein the second polishing inhibitor is selected from poly vinyl sulfonic acid (PVSA), poly vinyl sulfate (PVS), and salts thereof.

5. The method of claim 1, wherein the content of the first polishing inhibitor is in a range of about 0.001 wt. % to about 0.5 wt. %, based on about 100 wt. % of the slurry composition.

6. The method of claim 1, wherein the content of the second polishing inhibitor is in a range of about 0.001 wt. % to about 0.5 wt. %, based on about 100 wt. % of the slurry composition.

7. The method of claim 1, wherein the content of the dispersion stabilizer is in a range of about 0.001 wt. % to about 0.1 wt. %, based on about 100 wt. % of the slurry composition.

* * * * *